(12) United States Patent
Lee et al.

(10) Patent No.: US 11,545,196 B2
(45) Date of Patent: Jan. 3, 2023

(54) APPARATUS, MEMORY DEVICE, AND METHOD FOR STORING MULTIPLE PARAMETER CODES FOR OPERATION PARAMETERS

(71) Applicant: SAMSUNG ELECTRONICS CO., LTD., Suwon-si (KR)

(72) Inventors: Youngbin Lee, Seoul (KR); Kiho Kim, Daegu (KR); Jinhoon Jang, Uiwang-si (KR); Yeonkyu Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/466,754

(22) Filed: Sep. 3, 2021

(65) Prior Publication Data
US 2022/0148631 A1    May 12, 2022

(30) Foreign Application Priority Data
Nov. 10, 2020  (KR) .................. 10-2020-0149603

(51) Int. Cl.
*G11C 7/10* (2006.01)
*G11C 7/14* (2006.01)

(52) U.S. Cl.
CPC ........... *G11C 7/1063* (2013.01); *G11C 7/109* (2013.01); *G11C 7/1045* (2013.01); *G11C 7/14* (2013.01)

(58) Field of Classification Search
CPC ..... G11C 7/1063; G11C 7/1045; G11C 7/109; G11C 7/14
See application file for complete search history.

(56) References Cited

U.S. PATENT DOCUMENTS

| 7,400,165 B2 | 7/2008 | Park |
| 7,443,914 B2 | 10/2008 | Azenkot et al. |
| 7,852,915 B2 | 12/2010 | Chen |
| 8,902,964 B2 | 12/2014 | Aguilar-Arreola et al. |

(Continued)

FOREIGN PATENT DOCUMENTS

| CN | 111199762 A | 5/2020 |
| KR | 10-1649200 B1 | 8/2016 |

(Continued)

OTHER PUBLICATIONS

Communication dated Sep. 27, 2022 by the Taiwan Intellectual Property Office in Taiwan Application No. 110140576.

*Primary Examiner* — Han Yang
(74) *Attorney, Agent, or Firm* — Sughrue Mion, PLLC

(57) ABSTRACT

Provided are an apparatus, a memory device, and a method for storing a plurality of parameter codes for an operation parameter. The memory device includes a mode register and a control logic circuit. To set a first operating condition and a second operating condition for one operation parameter, the mode register stores a first parameter code for the operation parameter and a second parameter code, which is expressed as an offset value from the first parameter code. The control logic circuit sets the first operating condition as a current operating condition of the memory device by using the first parameter code based on a first control code and sets the second operating condition as the current operating condition of the memory device by using the first parameter code and the second parameter code based on a second control code.

20 Claims, 17 Drawing Sheets

(56) References Cited

U.S. PATENT DOCUMENTS

| | | |
|---|---|---|
| 8,966,353 B2 | 2/2015 | Zhou et al. |
| 9,397,868 B1 | 7/2016 | Hossain et al. |
| 9,521,021 B2 | 12/2016 | He et al. |
| 10,585,835 B1 * | 3/2020 | Durai ............ G11C 11/40 |
| 2007/0036006 A1 | 2/2007 | Janzen et al. |
| 2014/0340976 A1 | 11/2014 | Fujisawa |
| 2021/0287724 A1 * | 9/2021 | Gans ............ G11C 7/1045 |

FOREIGN PATENT DOCUMENTS

| | | |
|---|---|---|
| TW | 200735119 A | 9/2007 |
| TW | 201901457 A | 1/2019 |

\* cited by examiner

APPARATUS, MEMORY DEVICE, AND METHOD FOR STORING MULTIPLE PARAMETER CODES FOR OPERATION PARAMETERS

CROSS-REFERENCE TO RELATED APPLICATION

This application is based on and claims priority under 35 U.S.C. § 119 to Korean Patent Application No. 10-2020-0149603, filed on Nov. 10, 2020, in the Korean Intellectual Property Office, the disclosure of which is incorporated by reference herein in its entirety.

BACKGROUND

The present disclosure relates to an apparatus for storing a plurality of parameter codes for one operation parameter, a memory device, and a method of operating the same.

To support a high-speed interface with a memory device, a controller (or a central processing unit (CPU)) may provide a clock signal to the memory device. The memory device may process signals received from the controller in response to the clock signal received from the controller and synchronize signals transmitted to the controller with the clock signal. The memory device may support various data rates, e.g., 1600 Mbps, 2400 Mbps, 6400 Mbps, etc., according to the operating frequency of the clock signal. Due to the demand for high data rates, it is important to accurately capture signals transmitted between the controller and the memory device at high clock frequencies.

Typically, a memory device includes mode registers that provide various operation parameters and control parameters that are used to set operating conditions for the memory device. Examples of operation parameters and control parameters include parameters associated with a burst length, a read/write latency, a preamble/postamble length, an on-die termination (ODT) calibration, an impedance adjustment (ZQ) calibration, a reference voltage setting, etc.

The memory device transmits and receives data to and from the controller through data lines. Because the physical characteristics of the data lines are different from one to another, the characteristics of signals carried through the respective data lines may differ. When operating at a high clock frequency, data transmitted to the memory device has a data eye diagram state. The data eye diagram is shown as a superposition of multiple data transitions representing jitters due to noise. According to the environments of the respective data lines, data may appear as data eye diagrams of different distorted waveforms.

When receiving data according to signal characteristics of the respective data lines when the data is transmitted to the memory device is facilitated, a state in which eye opening regions of the data eye diagrams of the respective data lines are symmetrical and maximized may be found, thereby facilitating improvement of signal integrity (SI) characteristics of data.

SUMMARY

Example embodiments provide an apparatus, a memory device, and a method of operating the same for storing a plurality of codes for one operation parameter.

According to an aspect of an example embodiment, there is provided an apparatus including: a plurality of signal pins connected to a plurality of signal lines, wherein each of the signal pins of the plurality of signal pins is connected to a signal line of the plurality of signal lines and each signal line carries a signal; and a mode register set configured to store a first parameter code and a second parameter code for one operation parameter of the apparatus in a first register and a second register, respectively, wherein the first parameter code includes a global operation parameter code associated with an operating condition for signal pins associated with the one operation parameter, the second parameter code includes a per-pin operation parameter code associated with operating conditions of the respective signal pins associated with the one operation parameter, the per-pin operation parameter code is expressed as an offset value from the global operation parameter code.

According to an aspect of an example embodiment, there is provided a memory device configured to be set to a current operating condition, the memory device including: a mode register configured to store a first parameter code and a second parameter code for one operation parameter of the memory device to set a first operating condition and a second operating condition for the one operation parameter; and a control logic circuit configured to set the first operating condition as the current operating condition by using the first parameter code for the one operation parameter based on a first control code stored in the mode register and to set the second operating condition as the current operating condition by using the first parameter code and the second parameter code for the one operation parameter based on a second control code stored in the mode register, wherein the second parameter code is expressed as an offset value from the first parameter code.

According to an aspect of an example embodiment, there is provided a method of setting a current operating condition of a memory device, the method including: storing a first parameter code used to set a first operating condition for one operation parameter in a first register of a mode register; storing a second parameter code used to set a second operating condition for the one operation parameter in a second register of the mode register, wherein the second parameter code is expressed as an offset value from the first parameter code; setting the first operating condition as the current operating condition by using the first parameter code for the one operation parameter; and setting the second operating condition as the current operating condition by using the first parameter code and the second parameter code for the one operation parameter.

BRIEF DESCRIPTION OF THE DRAWINGS

The above and/or other aspects will be more clearly understood from the following detailed description of example embodiments taken in conjunction with the accompanying drawings in which.

DETAILED DESCRIPTION

Figure 1:
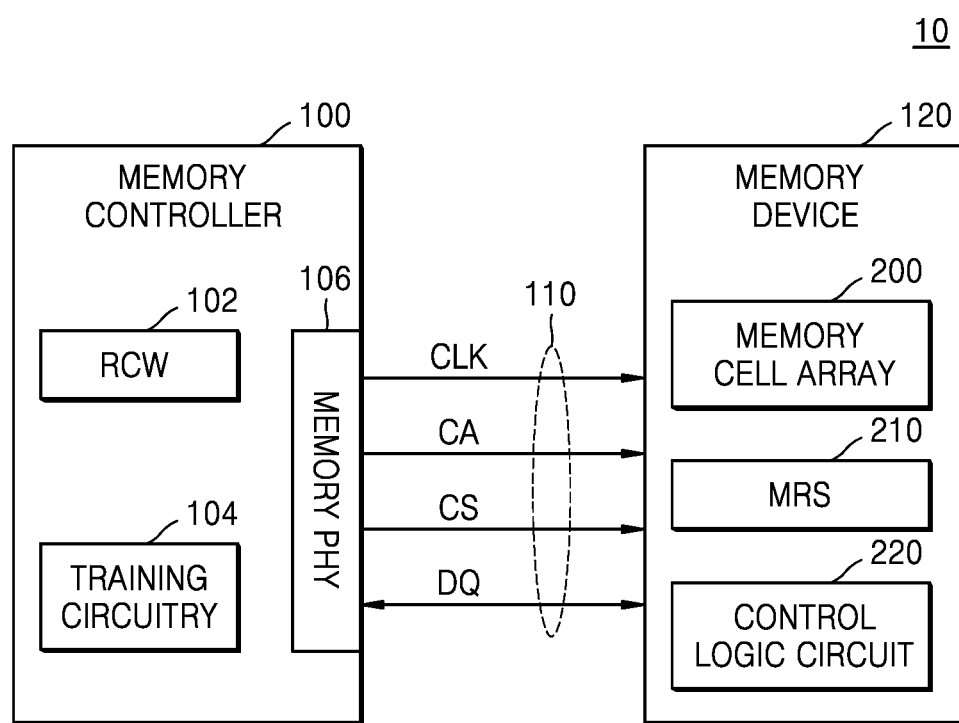
FIG. 1 is a block diagram showing a memory system including a memory device according to an example embodiment.

FIG. 1 is a block diagram showing a memory system including a memory device according to an example embodiment.

Referring to FIG. 1, a memory system 10 may include a memory controller 100 and a memory device 120. The memory system 10 may refer to an integrated circuit, an electronic device or system, a smartphone, a tablet PC, a computer, a server, a workstation, a portable communication terminal, a personal digital assistant (PDA), a portable multimedia player (PMP), a computing device like other suitable computers, a virtual machine, or a virtual computing device thereof. Alternatively, the memory system 10 may be one of components included in a computing system, e.g., a graphics card. According to example embodiments, the memory system 10 may be implemented as an Unbuffered Dual In-line Memory Module (UDIMM), a Registered DIMM (RDIMM), a Load Reduced DIMM (LRDIMM), a Fully Buffered DIMM (FBDIMM), a Small Outline DIMM (SODIMM), etc.

The memory controller 100 may be connected and communicated with the memory device 120 through a memory bus 110. The memory controller 100 may include a register control word (RCW) 102, a training circuitry 104, and a memory PHY 106.

The RCW 102 may be provided to control the memory device 120 according to initialization and/or operation characteristics. The RCW 102 may include various algorithms that configure the memory controller 100, such that the memory controller 100 may normally interact with the memory device 120. For example, codes indicating a frequency, a timing, a driving, and detailed operation parameters of the memory device 120 may be set to the RCW 102. A memory training of the memory device 120 may be performed according to codes set to the RCW 102.

The training circuitry 104 may perform a memory core parameter training associated with a memory core of the memory device 120 and/or a peripheral circuit parameter training for peripheral circuits other than the memory core, under the control of the memory controller 100. The training circuitry 104 may determine optimal parameters for memory core parameters and/or peripheral circuit parameters of the memory device 120. The training circuitry 104 may perform memory training of the memory device 120 through the memory controller 100. In the present example embodiment, although it is described that the training circuitry 104 is included in the memory controller 100, the training circuitry 104 may be included in the memory device 120, such that the memory device 120 may be the one performing a memory training.

The memory PHY 106 is a physical or electrical layer and a logical layer provided for signals, frequencies, timings, driving signals, detailed operation parameters, and functionality needed for efficient communication between the memory controller 100 and the memory device 120. The memory PHY 106 may support the features of a double data rate (DDR) protocol and/or a low power double data rate (LPDDR) protocol of the Joint Electron Device Engineering Council (JEDEC) standard.

The memory PHY 106 may connect the memory controller 100 to the memory device 120 through the memory bus 110. For simplicity of the drawings, it is illustrated that a clock signal CLK, a command/address signal CA, and data DQ are provided between the memory controller 100 and the memory device 120 via a single signal line, but they may actually be provided via a plurality of signal lines. Signal lines between the memory controller 100 and the memory device 120 may be connected through connectors. The connectors may be implemented as pins, balls, signal lines, or other hardware components.

Figure 11:
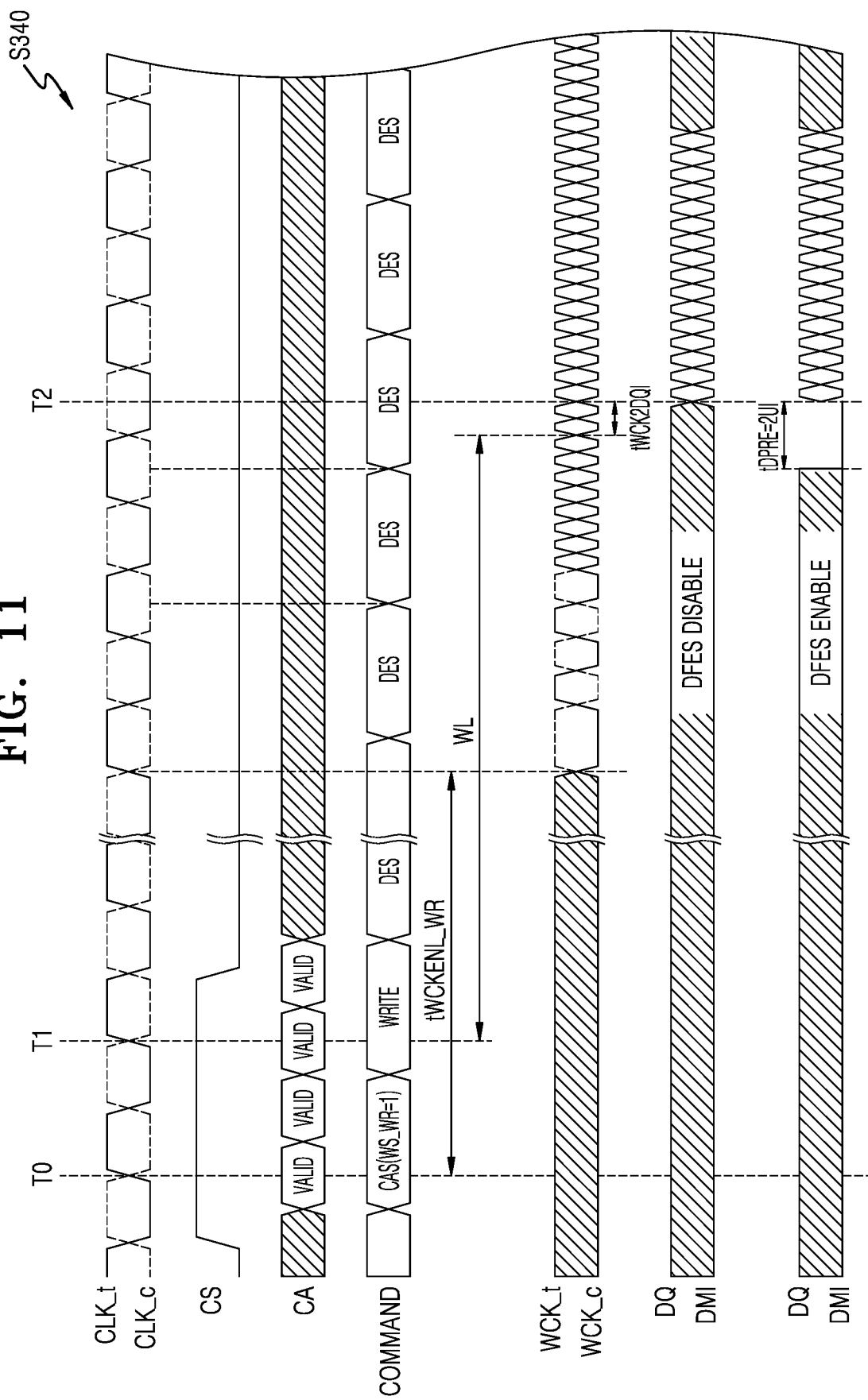
FIGS. 11 to 13 are diagrams for describing examples of operations of a memory device according to example embodiments.

A clock signal CLK may be transmitted from the memory controller 100 to the memory device 120 through a clock signal line of the memory bus 110. A command/address signal CA may be transmitted from the memory controller 100 to the memory device 120 through a command/address bus of the memory bus 110. A chip select signal CS may be transmitted from the memory controller 100 to the memory device 120 through a chip select line of the memory bus 110. A chip select signal CS activated to logic high may indicate that a command/address signal CA transmitted through the command/address bus is a command, as shown in FIG. 11. Data DQ may be transmitted from the memory controller 100 to the memory device 120 or from the memory device 120 to the memory controller 100 through a data bus of the memory bus 110 including bidirectional signal lines.

The memory device 120 may write data DQ or read data DQ under the control of the memory controller 100. The memory device 120 may include a memory cell array 200, a mode register set (MRS) 210, and a control logic circuit 220.

The memory cell array 200 may include a plurality of word lines, a plurality of bit lines, and a plurality of memory cells formed at points where the word lines intersect with the bit lines. Memory cells of the memory cell array 200 may include volatile memory cells (e.g., dynamic random access memory (DRAM) cells, static RAM (SRAM) cells, etc.), non-volatile memory cells (e.g., flash memory cells, resistive RAM (ReRAM) cells, phase change RAM (PRAM) cells, magnetic RAM (MRAM) cells, etc.), or some other type of memory cell.

The MRS 210 may be programmed to set a plurality of operation parameters, options, various functions, characteristics, and modes of the memory device 120. The MRS 210 may store a parameter code including appropriate bit values to be provided to the command/address bus of the memory bus 110 when an MRS command is issued by the memory controller 100.

For example, the MRS 210 may be used to control a burst length, read/write latency, a preamble/postamble length, write leveling enable/disable, decision feedback equalization (DFE) quantity, pull-down/on die termination (ODT), pull-up/output high level voltage (Voh) calibration, pre-emphasis, reference voltage setting, etc.

A burst length may be provided to set the maximum number of column locations that may be accessed for a read command and/or a write command. A read/write latency may be provided to define a clock cycle delay between a read and/or write command and a first bit of valid output and/or input data. Write leveling may be provided to enable or disable skew compensation between a clock signal and a data strobe signal during a write operation.

A DFE amount may be provided to subtract the remainder of bit of previously read data DQ to determine a current data bit. Pull-down/ODT and pull-up/Voh calibration may be provided to improve signal integrity (SI) by adjusting a swing width and/or driving intensity of signals received through the command/address bus and/or the data bus.

A pre-emphasis function may be provided to improve SI by increasing a data eye opening region of a signal transmitted through the data bus. A reference voltage setting may be provided to compare with a logic value of a received signal to determine the logic value. The voltage used to compare with the received signal may be called a decision level. For example, a first value of the received signal observed at the input of the sampler 920 of FIG. 9 which is above the decision level will, in some embodiments, cause the sampler to output a high voltage (a "1") as a value SDQ0. The level of the input can be varied using a VREF operation parameter. In contrast, if the first value of the received signal observed at the input of the sampler 920 of FIG. 9 which is below the decision level, will cause the sampler to output a low voltage (a "0") as the value SDQ0. Please see FIG. 9.

Also, the MRS 210 may be used to control a DRAM-related delay locked loop (DLL) reset, DLL enable/disable, output drive intensity, an additive latency, termination data strobe (TDQS) enable/disable, input/output buffer enable/disable, a CAS write latency, dynamic termination, a write cyclic redundancy check (CRC), a multipurpose register (MPR) location function, an MPR operation function, a gear down mode, an MPR read format, a power down mode, Vref monitoring, a read preamble training mode, a read preamble function, a write preamble function, a command and address (CA) parity function, a CRC error status, a CA parity error status, an ODT function, a data mask function, a write data bus inversion (DBI) function, a read DBI function, an error detection code (EDC) hold pattern, etc.

The control logic circuit 220 may receive the clock signal CLK through the clock signal line of the memory bus 110 and control an operation timing of the memory device 120. The operation timing of the memory device 120 may be provided based on a signal provided to the memory device 120, e.g., a strobe signal, in addition to the clock signal CLK. The control logic circuit 220 may receive a command received through the command/address bus and may generate control signals for performing various memory operations in the memory device 120 in response to the command.

Figure 2:
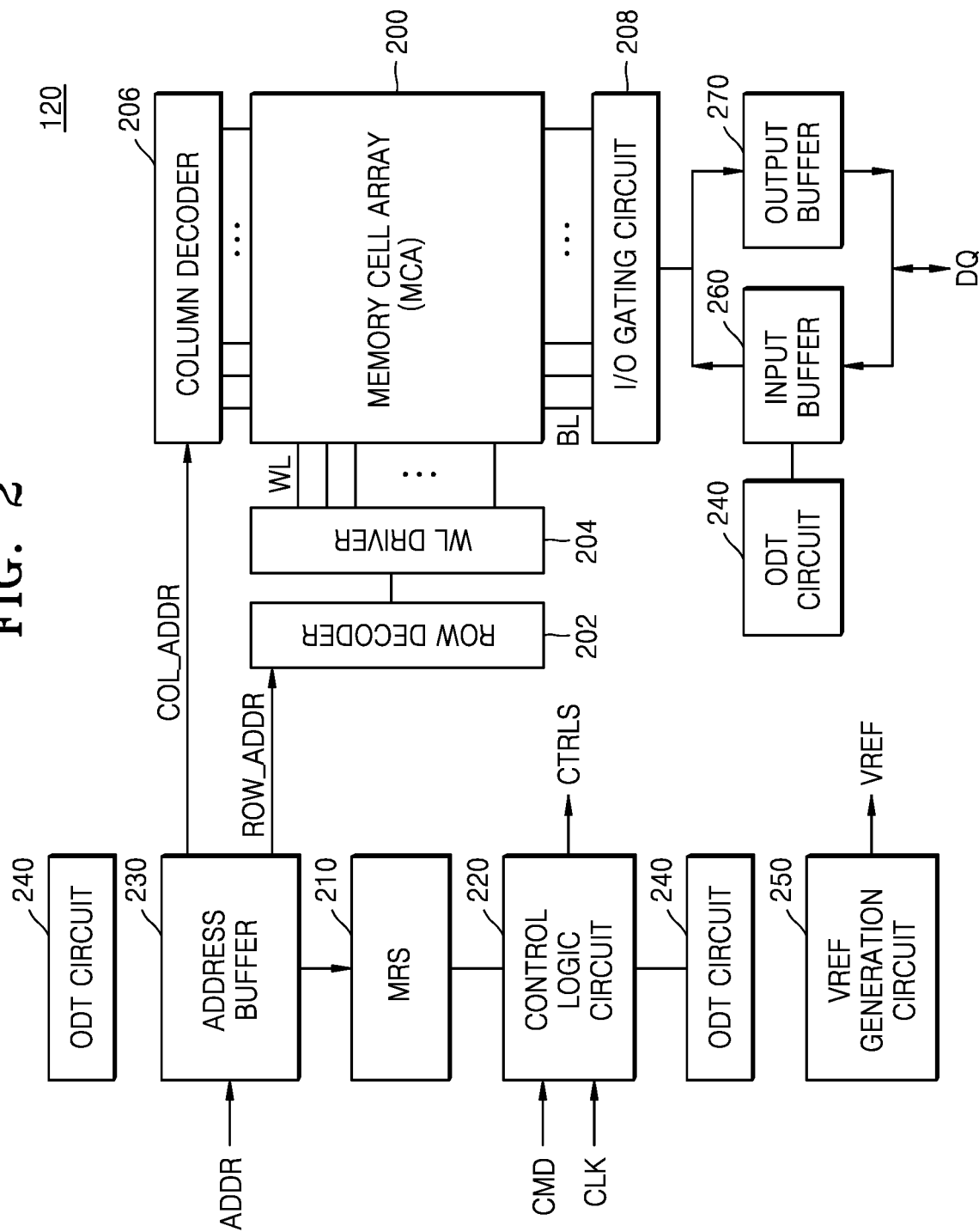
FIG. 2 is a block diagram of a memory device according to example embodiments.

FIG. 2 is a block diagram of a memory device according to example embodiments.

Referring to FIGS. 1 and 2, a memory device 120 may include a memory cell array 200, a row decoder 202, a word line driver 204, a column decoder 206, an input/output gating circuit 208, an MRS 210, a control logic circuit 220, an address buffer 230, an ODT circuit 240, a reference voltage generation circuit 250, a data input buffer 260, and a data output buffer 270.

The memory cell array 200 includes a plurality of memory cells provided in a matrix of rows and columns. The memory cell array 200 includes a plurality of word lines WL and a plurality of bit lines BL connected to the memory cells. The word lines WL may be connected to memory cells in rows, and a plurality of bit lines BL may be connected to memory cells in columns.

The row decoder 202 may select any one of the word lines WL connected to the memory cell array 200. The row decoder 202 may decode a row address ROW_ADDR received from the address buffer 230, select any one word line WL corresponding to the row address ROW_ADDR, and connect a selected word line WL to the word line driver 204 that activates the selected word line WL. The column decoder 206 may select predetermined bit lines BL from among the bit lines BL of the memory cell array 200. The column decoder 206 may generate a column select signal CSL by decoding a column address COL_ADDR received from the address buffer 230 and connect bit lines BL selected by the column select signal CSL to the input/output gating circuit 208. The input/output gating circuit 208 may include read data latches for storing read data of the bit lines BL selected by the column select signal CSL and a write driver for writing write data to the memory cell array 200. Read data stored in the read data latches of the input/output gating circuit 208 may be provided to the data bus through the data output buffer 270. Write data may be applied to the memory cell array 200 through the data input buffer 260 connected to the data bus and through the write driver of the input/output gating circuit 208.

The control logic circuit 220 may receive a clock signal CLK and a command CMD and generate control signals CTRLS for controlling an operation timing and/or a memory operation of the memory device 120. The control logic circuit 220 may use the control signals CTRLS to read data from the memory cell array 200 and to write data to the memory cell array 200.

The MRS 210 may store information used by the control logic circuit 220 to configure the operation of the memory device 120 to set an operating condition for the memory device 120. The MRS 210 may include a register that stores parameter codes for various operation parameters and control parameters used to set an operating condition of the memory device 120. A parameter code may be received by the memory device 120 through the command/address bus. The control logic circuit 220 provides control signals CTRLS to circuits of the memory device 120 to operate as set by operation parameters and control parameters stored in the MRS 210. In general, the term "parameter" refers to a variable and the term "parameter code" refers to a pattern of bits used on the c/a bus to execute a command related to the variable.

To minimize the transmission time of signals transmitted/received to/from the memory device 120, swing widths of the signals are decreased. As the swing widths of signals decrease, the influence of external noise on the memory device 120 increases, and signal reflection caused by impedance mismatch at an interface becomes serious. To solve impedance mismatch, the memory device 120 controls impedance matching by performing a ZQ calibration operation.

A pull-down/ODT calibration may be provided to turn a termination resistance on/off for a target memory device and/or to fix the termination resistance for a non-target target memory device. A pull-up/Voh calibration may be provided to satisfy a VOH specification SPEC by adjusting a pull-up strength in a read operation. The pull-down/ODT calibration and the pull-up/Voh calibration may be referred to as an impedance adjusting operation for constantly adjusting an output and/or termination resistance of the memory device 120, a ZQ calibration, or an offset removal operation.

The ODT circuit 240 may provide termination resistance when being enabled for the command/address bus and/or the data bus. The termination resistance may improve the SI of signals received through a bus. The enabling of the ODT circuit 240 and the magnitude of the termination resistance provided to a bus may be set by storing a suitable parameter code to the MRS 210.

The reference voltage generation circuit 250 may provide a reference voltage VREF used by circuits of the memory device 120. For example, the reference voltage VREF may be used by the control logic circuit 220 for comparison with a voltage of a signal received from a command bus to determine a logic value of the signal. The reference voltage VREF and/or the range of the reference voltage VREF may be set by storing a reference voltage operation parameter code in the MRS 210.

Figure 3:
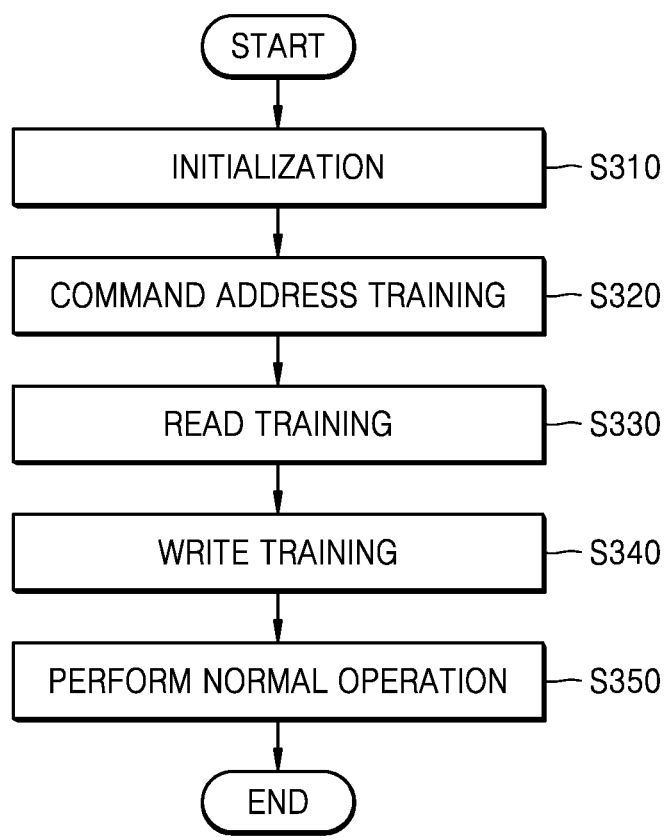
FIG. 3 is a flowchart showing the operation of the memory system of FIG. 1.

FIG. 3 is a flowchart showing the operation of the memory system of FIG. 1.

Referring to FIGS. 1, 2, and 3, in operation S310, the memory system 10 may perform initialization. When the memory system 10 is powered up, the memory controller 100 and the memory device 120 may perform an initial setting operation according to a pre-set method. Default operation parameters may be set during the initialization of the memory device 120.

In operation S320, the memory system 10 may perform a command address training operation. The memory controller 100 and the memory device 120 may perform a command address training operation to improve timing margins of a command CMD and an address ADDR.

In operation S330, the memory system 10 may perform a read training operation. The memory controller 100 may adjust an operation parameter code of the memory device 120 to have an optimal SI and a data eye diagram for data read from the memory device 120.

In operation S340, the memory system 10 may perform a write training operation. The memory controller 100 may transmit data to the memory device 120 and adjust an operation parameter code of the memory device 120, such that transmitted data has an optimal SI and a data eye diagram.

In operation S350, after the initialization operation and the training operations are performed in operations S310 to S340, the memory system 10 may perform a normal operation.

Figure 4:
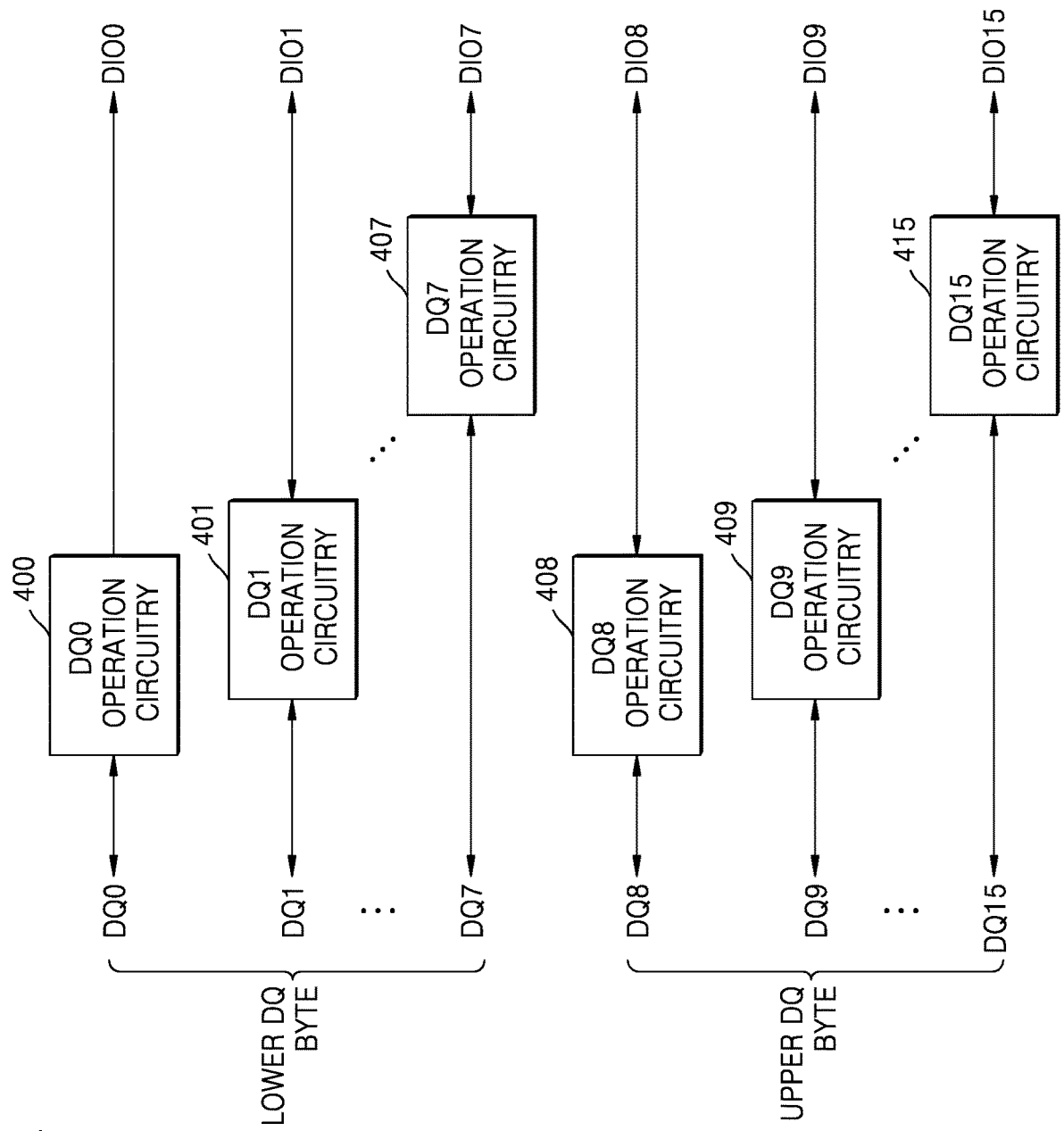
FIG. 4 is a conceptual diagram for describing a data operation circuitry according to example embodiments.

FIG. 4 is a conceptual diagram for describing a data operation circuitry according to example embodiments. In the following example embodiments, the terms data DQ and DQ may be used interchangeably for convenience of explanation.

Referring to FIGS. 2 and 4, a plurality of DQ lines may transmit and receive internal data DIO (hereinafter referred to as "DIO data") through a plurality of DQ operation circuitries 400 to 407 and 408, 409 to 415. The DQ operation circuitries 400 to 408 and 408 to 415 may each be the ODT circuit 240, the reference voltage generation circuit 250, the data input buffer 260, the data output buffer 270, or a DFE.

In general a signal pin connected to a DQ line may be referred to as a DQ pin. A collection of these may be referred to as DQ pins.

A DQ0 line may transmit and receive DIO0 data through the DQ0 operation circuitry 400. DQ1 to DQ7 lines may transmit and receive DIO1 to DIO7 data through DQ1 to DQ7 operation circuitries 401 to 407. Likewise, DQ8 to DQ15 lines may receive DIN8 to DIN15 input data through DQ8 to DQ15 operation circuitries 408 to 415. DQ0 to DQ7 may be referred to as lower DQ bytes DQ[7:0], and DQ8 to DQ15 may be referred to as upper DQ bytes DQ[15:8].

Figure 5A:
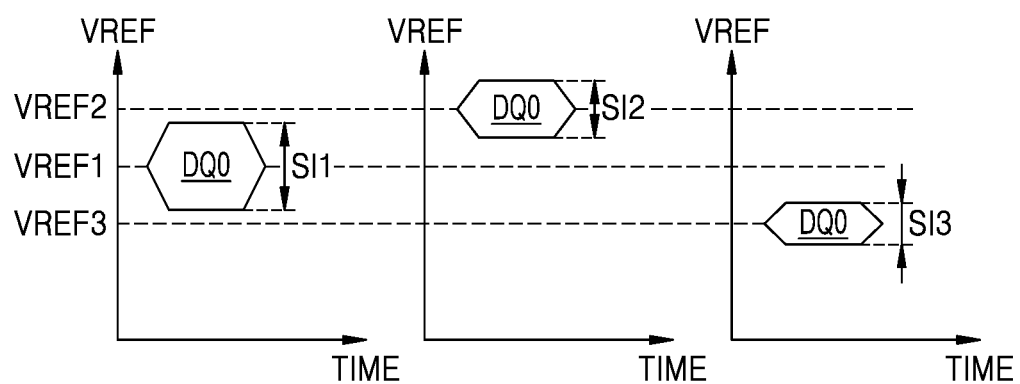
FIGS. 5A, 5B and 5C are diagrams for describing a reference voltage for the data lines of FIG. 4.
Figure 5B:
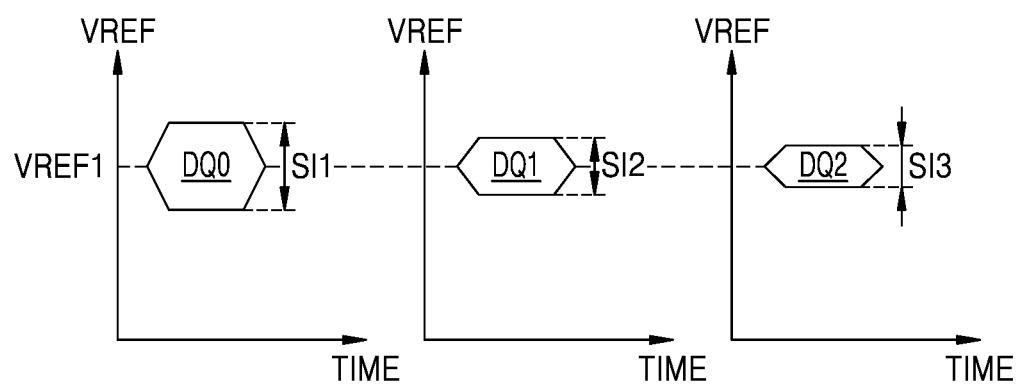
Figure 5C:
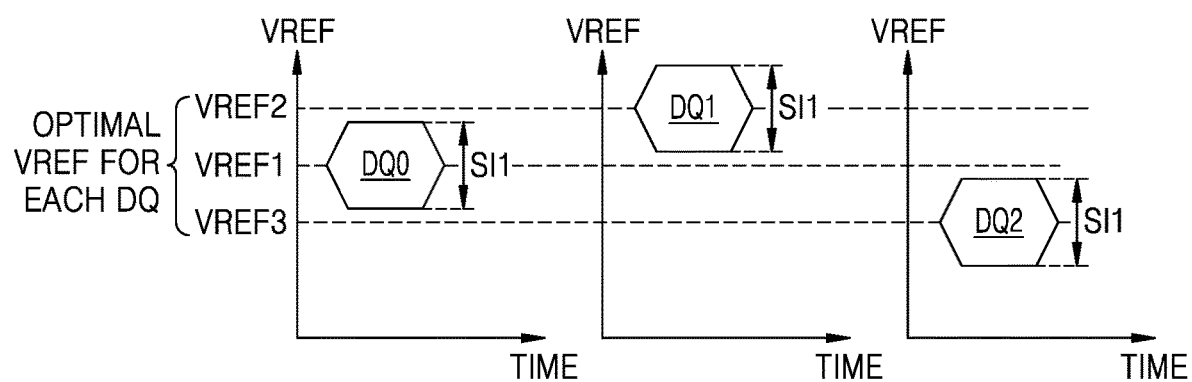

FIGS. 5A to 5C are diagrams for describing the reference voltage VREF for the data lines of FIG. 4.

FIG. 5A shows the SI of the DQ0 line when the reference voltage VREF of the DQ0 line is set to VREF1, VREF2, and VREF3. SI refers to a size, a vertical height, or a width of a data eye diagram of a signal received through a DQ line. The greater the SI is, the more accurately DQ may be identified. When the reference voltage VREF of the DQ0 line is set to VREF1, the DQ0 line may have SI1 signal integrity. When the reference voltage VREF of the DQ0 line is set to VREF2 or VREF3, the DQ0 line may have SI2 signal integrity or SI3 signal integrity. It may be seen that the SI2 signal integrity or the SI3 signal integrity is less than the SI1 signal integrity. In other words, when the reference voltage VREF of the DQ0 line is set to VREF1, the DQ0 line may have an optimal SI.

Referring to FIG. 5B, when reference voltages VREF of the DQ0, DQ1, and DQ2 lines are set to VREF1, the DQ0, DQ1, and DQ2 lines may have the SI1 signal integrity, the SI2 signal integrity, and SI3 signal integrity, respectively. This is because the physical characteristics of the DQ0, DQ1, and DQ2 lines are different from one another. In other words, when the reference voltage VREF is the same, different SI may be obtained due to locations or physical characteristics of DQ lines different from one another. In other words, when the reference voltage VREF is set to VREF1, the DQ0 line may have the optimal SI, but DQ1 and DQ2 lines may not have optimal SI.

Referring to FIG. 5C, the reference voltage VREF of the DQ0 line may be set to VREF1, the reference voltage VREF of the DQ1 line may be set to VREF2, and the reference voltage VREF of the DQ2 line may be set to VREF3. In this case, DQ0, DQ1, and DQ2 lines may each have the optimal SI. In other words, by setting different reference voltages VREF respectively to the DQ0, DQ1, and DQ2 lines, each DQ line may have the optimal SI.

The optimal reference voltage VREF for each of the above-described DQ lines may be determined through a read training operation or a write training operation in operation S330 or operation S340 of FIG. 3, and information regarding the same may be stored in the MRS 210 as a reference voltage parameter code.

Figure 8:
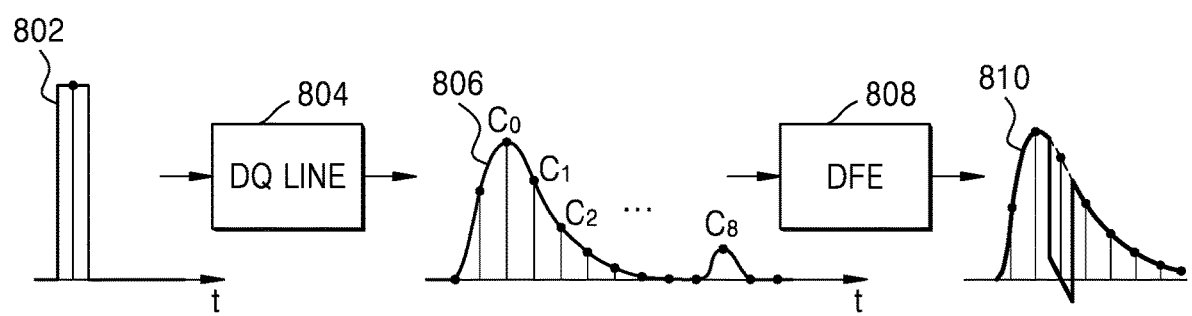
FIG. 8 is a diagram showing an effect of a decision feedback equalizer (DFE) of a data line according to example embodiments.

An eye diagram moving up or down with reference level as shown in FIGS. 5A-5C indicates changing a reference level to sample the voltage traversing the eye at a different level. That is, the representation in FIGS. 5A-5C indicates adding a DC offset to a signal line in order to minimize error occurring by the sampler 920 of FIG. 9. For example, based on the offset added, the DFE output 810 of FIG. 8 is adjusted to occur at an optimal level at the input of the sampler 920 of FIG. 9.

Figure 6:
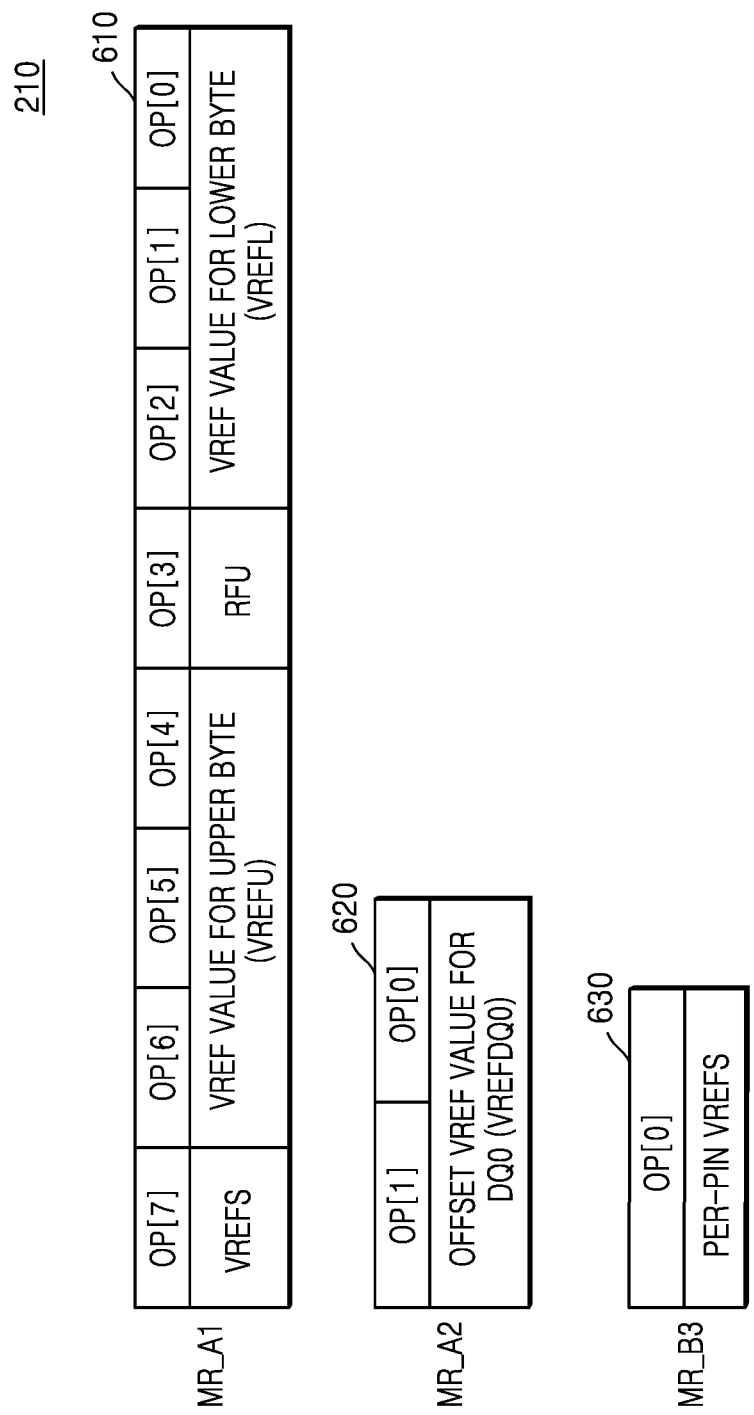
FIG. 6 is a diagram showing a portion of a mode register set (MRS) according to example embodiments.

FIG. 6 is a diagram showing a portion of the MRS 210 according to example embodiments.

Referring to FIGS. 2 and 6, the MRS 210 may include a first mode register 610, a second mode register 620, and a third mode register 630. First, second, and third mode registers 610, 620, and 630 each represent a group of registers associated with each mode register, which may be identified by each mode register address. The first mode register 610 may be identified by a first mode register address MR_A1, the second mode register 620 may be identified by a second mode register address MR_A2, and the third mode register 630 may be identified by a third mode register address MR_A3.

The first, second, and third mode registers 610, 620, and 630 may store operation parameter codes regarding the reference voltage VREF of DQ lines. The first mode register 610 has three parameter codes that are stored for the reference voltage VREF by a plurality of registers OP[7:0].

OP[2:0] registers may store a parameter VREFL that sets the reference voltage VREF of DQ lines of the lower DQ bytes DQ[7:0]. The reference voltage parameter VREFL for the lower DQ bytes DQ[7:0] stored in the OP[2:0] registers may be expressed by a 3-bit parameter code and may have, for example, 8 setup points or step coefficients. OP[6:4] registers may store a parameter VREFU that sets the reference voltage VREF of DQ lines of the upper DQ bytes DQ[15:8]. The reference voltage parameter VREFU for the upper DQ bytes DQ[15:8] stored in the OP[6:4] registers may be expressed by a 3-bit parameter code and may have, for example, 8 setup points or step coefficients. Reference voltage parameters VREFL and VREFU for the lower DQ bytes DQ[7:0] and the upper DQ bytes DQ[15:8] may be referred to as global reference voltage parameters. An OP[7] register may store a control parameter VREFS indicating whether the global reference voltage operation parameters VREFL and VREFU are supported for DQ lines of the lower DQ bytes DQ[7:0] and the upper DQ bytes DQ[15:8]. The control parameter VREFS may be a 1-bit parameter code.

According to example embodiments, the global reference voltage operation parameters VREFL and VREFU for the lower DQ bytes DQ[7:0] and the upper DQ bytes DQ[15:8] may be expressed by bits less than or more than 3 bits. The control parameter VREFS indicating whether the global reference voltage operation parameters VREFL and VREFU for the reference voltage VREF regarding DQ lines are supported may include more than 1 bit.

The second mode register 620 has a parameter code that is stored for the reference voltage VREF of the DQ0 line by OP [1:0] registers. The OP [1:0] registers may store a reference voltage sub-parameter VREFDQ0 that sets the reference voltage VREF of DQ0 lines. The reference voltage sub-parameter VREFDQ0 regarding the DQ lines stored in the OP[1:0] registers may be expressed by a 2-bit parameter code and may have, for example, 4 setup points or step coefficients.

The DQ0 line may have a reference voltage VREF having the optimal SI through a read training operation or a write training operation in operation S330 or operation S340 of FIG. 3. The reference voltage VREF set by the reference voltage parameter VREFL for the lower DQ bytes DQ[7:0] stored in the OP[2:0] registers of the first mode register 610 will be applied to the DQ0 line. In the DQ0 line, a voltage difference, that is, an offset, may occur between the reference voltage VREF set by the reference voltage parameter VREFL for the lower DQ bytes DQ[7:0] and the reference voltage VREF with an optimal SI obtained through a training operation. The reference voltage sub-parameter VREFDQ0 for the DQ0 line may refer to such an offset. In other words, the DQ0 line may set the reference voltage VREF by applying (e.g., subtracting or adding) the reference voltage sub-parameter VREFDQ0 with respect to the reference voltage VREF set by the reference voltage parameter VREFL for the lower DQ bytes DQ[7:0]. Therefore, the DQ0 line may have the reference voltage VREF with the optimal SI. The reference voltage sub-parameter VREFDQ0 with respect to the reference voltage VREF of the DQ0 line may be referred to as a per-pin reference voltage operation parameter.

The third mode register 630 has a parameter code that is stored for the reference voltage VREF of a DQ line by an OP[0] register. The OP[0] register may store a control parameter Per-pin VREFS indicating whether the per-pin reference voltage parameter VREFDQ0 is supported for the reference voltage VREF of the DQ0 line. The control parameter Per-pin VREFS may be a 1-bit parameter code.

According to example embodiments, the reference voltage sub-parameter VREFDQ0 with respect to the reference voltage VREF of the DQ0 line may be expressed by bits less than or more than 2 bits. The control parameter Per-pin VREFS indicating whether the reference voltage sub-parameter VREFDQ0 is supported may include more than 1 bit.

Figure 7:
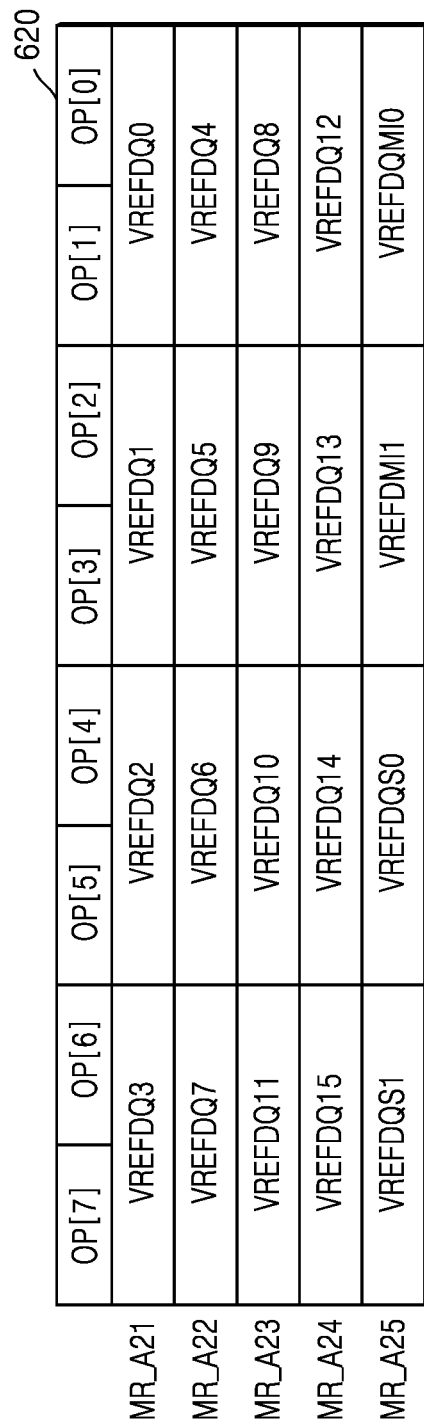
FIG. 7 is a diagram showing a portion of a MRS according to example embodiments.

FIG. 7 is a diagram showing a portion of the MRS 210 according to example embodiments. FIG. 7 shows an example of setting the per-pin reference voltage parameter VREFDQ0 applied to the reference voltage VREF of the DQ0 line of FIG. 6 and to other DQ lines as well.

Referring to FIGS. 6 and 7, a plurality of mode registers have parameter codes stored with respect to reference voltages of DQ[15:0] lines and lines of signals related to DQ[15:0] (e.g., a data mask/invert signal DMI, a data strobe signal DQS, etc.).

In a mode register identified by an MR_A21 mode register address, OP[1:0] registers may store the reference voltage sub-parameter VREFDQ0 applied to set the reference voltage VREF of the DQ0 line. A reference voltage sub-parameter VREFDQ1 applied to set the reference voltage VREF of the DQ1 line may be stored by OP[3:2] registers, a reference voltage sub-parameter VREFDQ2 applied to set the reference voltage VREF of the DQ2 line may be stored by OP[5:4] registers, and a reference voltage sub-parameter VREFDQ3 applied to set the reference voltage VREF of the DQ3 line may be stored by OP[7:6] registers.

In a mode register identified by an MR_A22 mode register address, OP[1:0] registers may store a reference voltage sub-parameter VREFDQ4 applied to set the reference voltage VREF of a DQ4 line. A reference voltage sub-parameter VREFDQ5 applied to set the reference voltage VREF of a DQ5 line may be stored by OP[3:2] registers, a reference voltage sub-parameter VREFDQ6 applied to set the reference voltage VREF of a DQ6 line may be stored by OP[5:4] registers, and a reference voltage sub-parameter VREFDQ7 applied to set the reference voltage VREF of a DQ7 line may be stored by OP[7:6] registers.

Reference voltage sub-parameters VREFDQ[7:0] stored in mode registers corresponding to MR_A21 and MR_A22 mode register addresses may be selectively used based on the reference voltage parameter VREFL regarding the lower DQ bytes DQ[7:0] stored in the OP[2:0] registers of the first mode register 610 of FIG. 6. When the control parameter Per-pin VREFS indicating whether a per-pin reference voltage operation parameter is supported by the OP[0] register of the third mode register 630 is enabled, DQ[7:0] lines may each apply the reference voltage sub-parameter VREFDQ[7:0] to the reference voltage VREF set by the reference voltage parameter VREFL regarding the lower DQ bytes DQ[7:0], thereby setting an optimal reference voltage VREF.

In a mode register identified by an MR_A23 mode register address, OP[1:0] registers may store a reference voltage sub-parameter VREFDQ8 applied to set the reference voltage VREF of a DQ8 line. A reference voltage sub-parameter VREFDQ9 applied to set the reference voltage VREF of a DQ9 line may be stored by OP[3:2] registers, a reference voltage sub-parameter VREFDQ10 applied to set the reference voltage VREF of a DQ10 line may be stored by OP[5:4] registers, and a reference voltage sub-parameter VREFDQ11 applied to set the reference voltage VREF of a DQ11 line may be stored by OP[7:6] registers.

In a mode register identified by an MR_A24 mode register address, OP[1:0] registers may store a reference voltage sub-parameter VREFDQ12 applied to set the reference voltage VREF of a DQ12 line. A reference voltage sub-parameter VREFDQ13 applied to set the reference voltage VREF of a DQ13 line may be stored by OP[3:2] registers, a reference voltage sub-parameter VREFDQ14 applied to set the reference voltage VREF of a DQ14 line may be stored by OP[5:4] registers, and a reference voltage sub-parameter VREFDQ15 applied to set the reference voltage VREF of a DQ15 line may be stored by OP[7:6] registers.

Reference voltage sub-parameters VREFDQ[15:8] stored in mode registers corresponding to MR_A23 and MR_A24 mode register addresses may be selectively used based on the reference voltage parameter VREFU regarding the upper DQ bytes DQ[15:8] stored in the OP[6:4] registers of the first mode register 610 of FIG. 6. When the control parameter Per-pin VREFS indicating whether a per-pin reference voltage operation parameter is supported by the OP[0] register of the third mode register 630 is enabled, DQ[15:8] lines may each apply the reference voltage sub-parameter VREFDQ[15:8] to the reference voltage VREF set by the reference voltage parameter VREFU regarding the upper DQ bytes DQ[15:8], thereby setting an optimal reference voltage VREF.

In a mode register identified by an MR_A25 mode register address, OP[1:0] registers may store a reference voltage sub-parameter VREFDMI0 applied to set the reference voltage VREF of a first data mask/invert signal DMI0 line (a line for a first data mask/invert signal DMI0, and OP[3:2] registers may store a reference voltage sub-parameter VREFDMI1 applied to set the reference voltage VREF of a second data mask/invert signal DMI1 line. OP[5:4] registers may store a reference voltage sub-parameter VREFDQS0 applied to set the reference voltage VREF of a first data strobe signal DQS0 line, and OP[7:6] registers may store a reference voltage sub-parameter VREFDQS1 applied to set the reference voltage VREF of a second data strobe signal DQS1 line.

The first data mask/invert signal DMI0 and the first data strobe signal DQS0 may be used as a clock signal and a control signal for the lower DQ bytes DQ[7:0]. When the lower DQ bytes DQ[7:0] are transmitted/received through the DQ bus of the memory bus 110 (FIG. 1), the first data mask/invert signal DMI0 line and the first data strobe signal DQS0 line may apply reference voltage sub-parameters VREFDBI0 and VREFDQS0 with respect to the reference voltage VREF set by the reference voltage parameter VREFL regarding the lower DQ bytes DQ[7:0], thereby setting optimal reference voltages VREF of the first data mask/invert signal DMI0 line and the first data strobe signal DQS0 line, respectively.

The second data mask/invert signal DMI1 and the second data strobe signal DQS1 may be used as a clock signal and a control signal for the upper DQ bytes DQ[15:8]. When the upper DQ bytes DQ[15:8] are transmitted/received through the DQ bus of the memory bus 110, the second data mask/invert signal DMI1 line and the second data strobe signal DQS1 line may apply reference voltage sub-parameters VREFDBI1 and VREFDQS1 with respect to the reference voltage VREF set by the reference voltage parameter VREFU regarding the upper DQ bytes DQ[15:8], thereby setting optimal reference voltages VREF of the second data mask/invert signal DMI1 line and the second data strobe signal DQS1 line, respectively.

FIG. 8 is a diagram showing an effect of a DFE of a DQ line according to example embodiments.

Referring to FIG. 8, a DQ line 804 may undergo loss and signal reflection. In the DQ line 804, inter-symbol interference (ISI) may cause one bit of data to interfere with a subsequent bit and be distorted (i.e., smear out and spill over). One bit of a data signal 802 transmitted through the DQ line 804 may be received as a distorted signal 806 with residue of a previous bit. ISI may become more significant as a data rate increases and a pulse width representing a data bit becomes narrower in correspondence thereto. Values of distorted signals 806 received at respective sampling points may be referred to as tap values corresponding to the data signal 802 transmitted through the DQ line 804, e.g., a main tap value C0, a first tap value C1, a second tap value C2, etc.

A DFE 808 may calibrate the distorted signals 806 received at respective sampling points by subtracting residues of previous bits to determine a current bit and generate a calibrated signal 810. Although FIG. 8 shows an example in which only the first tap value C1 is calibrated by the DFE 808, it is merely for convenience of explanation, and embodiments are not limited thereto.

Figure 9:
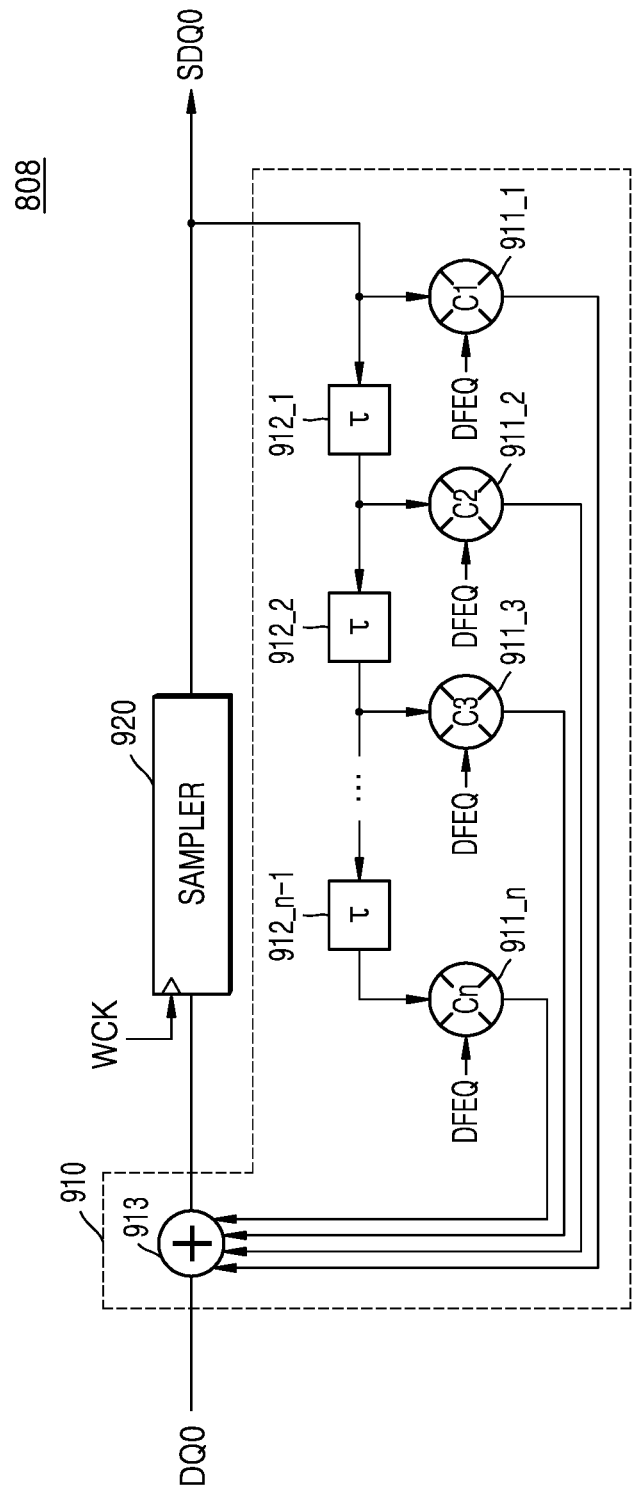
FIG. 9 is a diagram for describing the DFE of FIG. 8.

FIG. 9 is a diagram for describing the DFE 808 of FIG. 8.

Referring to FIG. 9, the DFE 808 may include a filtering unit 910 for calibrating received DQ0 data and a sampler 920 for sampling filtered data. The filtering unit 910 may include a plurality of coefficient multipliers (also referred to as DFE taps) 911_1 to 911_$n$ that multiply delayed samples by tap values C1 to Cn, respectively. The delayed samples may be provided by a plurality of delay units 912_1, 912_2, 912_3 to 912_($n$–1) that delay a sampled signal SDQ0 received from the sampler 920. An adder 913 may add or subtract the tap values C1 to Cn to or from DQ0 data before forwarding a signal calibrated by the filtering unit 910 to the sampler 920. The sampler 920 may sample a calibrated signal in a certain sample period set by a write clock signal WCK. The DFE taps 911_1 to 911_$n$ may each receive a DFE quantity DFEQ optimized for the DQ0 data and multiply delayed samples by the same to determine the tap values C1 to Cn. The DFE quantity DFEQ may be provided from the MRS 210 (FIG. 2). According to example embodiments, the DFE 808 may be included in the data input buffer 260 of FIG. 2.

The optimal DFE quantity for each of DQ[15:0] lines including the DQ0 line may be determined through a read training operation or a write training operation in operation S330 or operation S340 of FIG. 3, and information regarding the same may be stored in the MRS 210 as a parameter code.

Figure 10:
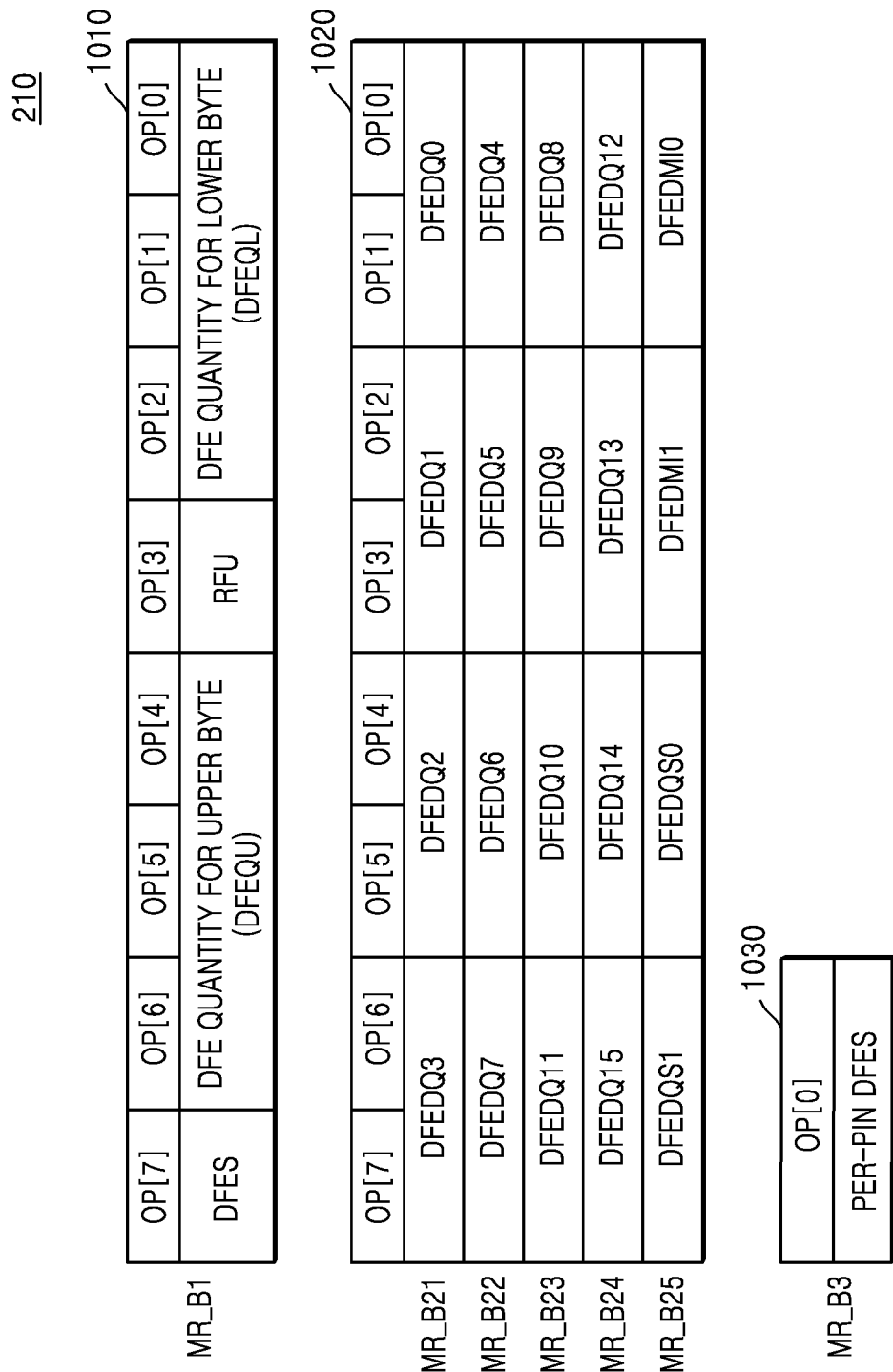
FIG. 10 is a diagram showing a portion of a MRS according to example embodiments.

FIG. 10 is a diagram showing a portion of the MRS 210 according to example embodiments.

Referring to FIGS. 2, 9, and 10, the MRS 210 may include a first mode register 1010, a second mode register 1020, and a third mode register 1030. First, second, and third mode registers 1010, 1020, and 1030 represent groups of registers associated with the DFE quantity DFEQ and may store operation parameter codes regarding the DFE quantity DFEQ of the DQ[15:0] line. In this example embodiment, the DFE quantity DFEQ corresponding to the first tap value C1 is illustrated.

In the first mode register 1010 identified by an MR_B1 mode register address, OP[2:0] registers may store a parameter DFEQL that sets the DFE quantity DFEQ of the DQ lines of the lower DQ bytes DQ[7:0]. A DFE quantity parameter DFEQL for the lower DQ bytes DQ[7:0] stored in the OP[2:0] registers may be expressed by a 3-bit parameter code and may have, for example, 8 setup points or step coefficients. OP[6:4] registers may store a parameter DFEQU that sets the DFE quantity DFEQ of the DQ lines of the upper DQ bytes DQ[15:8]. The DFE quantity parameter DFEQU for the upper DQ bytes DQ[15:8] stored in the OP[6:4] registers may be expressed by a 3-bit parameter code and may have, for example, 8 setup points or step coefficients. The parameter DFEQL that sets the DFE quantity DFEQ of the DQ lines of the lower DQ bytes DQ[7:0] and the parameter DFEQU that sets the DFE quantity DFEQ of the DQ lines of the upper DQ bytes DQ[15:8] may be referred to as global DFE quantity parameters. An OP[7] register may store a one-bit control parameter DFES indicating whether parameters DFEQL and DFEQU regarding the DFE quantities are supported for the DQ lines of the lower DQ bytes DQ[7:0] and the upper DQ bytes DQ[15:8].

According to example embodiments, the global DFE quantity parameters DFEQL and DFEQU for the lower DQ bytes DQ[7:0] and the upper DQ bytes DQ[15:8] may be expressed by bits less than or more than 3 bits. The control parameter DFES indicating whether the global DFE quantity parameters DFEQL and DFEQU are supported for DQ lines may include more than 1 bit.

The second mode register 1020 has a parameter code that sets the DFE quantity DFEQ of the DQ[15:0] lines and the lines of signals related to DQ[15:0] (e.g., a data mask/invert signal DMI, a data strobe signal DQS, etc.). In a mode register identified by an MR_B21 mode register address, OP[1:0] registers may store the DFE quantity sub-parameter DFEDQ0 applied to set the DFE quantity DFEQ of the DQ0 line. A DFE quantity sub-parameter DFEDQ1 applied to set the DFE quantity DFEQ of a DQ1 line may be stored by OP[3:2] registers, a DFE quantity sub-parameter DFEDQ2 applied to set the DFE quantity DFEQ of a DQ2 line may be stored by OP[5:4] registers, and a DFE quantity sub-parameter DFEDQ3 applied to set the DFE quantity DFEQ of a DQ3 line may be stored by OP[7:6] registers. In a mode register identified by an MR_B22 mode register address, OP[1:0] registers may store a DFE quantity sub-parameter DFEDQ4 applied to set the DFE quantity DFEQ of the DQ4 line. A DFE quantity sub-parameter DFEDQ5 applied to set the DFE quantity DFEQ of a DQ5 line may be stored by OP[3:2] registers, a DFE quantity sub-parameter DFEDQ6 applied to set the DFE quantity DFEQ of a DQ6 line may be stored by OP[5:4] registers, and a DFE quantity sub-parameter DFEDQ7 applied to set the DFE quantity DFEQ of a DQ7 line may be stored by OP[7:6] registers.

In a mode register identified by an MR_B23 mode register address, OP[1:0] registers may store a DFE quantity sub-parameter DFEDQ8 applied to set the DFE quantity DFEQ of the DQ8 line. A DFE quantity sub-parameter DFEDQ9 applied to set the DFE quantity DFEQ of a DQ9 line may be stored by OP[3:2] registers, a DFE quantity sub-parameter DFEDQ10 applied to set the DFE quantity DFEQ of a DQ10 line may be stored by OP[5:4] registers, and a DFE quantity sub-parameter DFEDQ11 applied to set the DFE quantity DFEQ of a DQ11 line may be stored by OP[7:6] registers. In a mode register identified by an MR_B24 mode register address, OP[1:0] registers may store a DFE quantity sub-parameter DFEDQ12 applied to set the DFE quantity DFEQ of the DQ12 line. A DFE quantity sub-parameter DFEDQ13 applied to set the DFE quantity DFEQ of a DQ13 line may be stored by OP[3:2] registers, a DFE quantity sub-parameter DFEDQ14 applied to set the DFE quantity DFEQ of a DQ14 line may be stored by OP[5:4] registers, and a DFE quantity sub-parameter DFEDQ15 applied to set the DFE quantity DFEQ of a DQ15 line may be stored by OP[7:6] registers.

In a mode register identified by an MR_B25 mode register address, OP[1:0] registers may store a DFE quantity sub-parameter DFEDMI0 applied to set the DFE quantity DFEQ of the first data mask/invert signal DMI0 line, and OP[3:2] registers may store a DFE quantity sub-parameter DFEDMI1 applied to set the DFE quantity DFEQ of the second data mask/invert signal DMI1 line. OP[5:4] registers may store a DFE quantity sub-parameter DFEDQS0 applied to set the DFE quantity DFEQ of the first data strobe signal DQS0 line, and OP[7:6] registers may store a DFE quantity sub-parameter DFEDQC1 applied to set the DFE quantity DFEQ of the second data strobe signal DQS1 line.

The third mode register 1030 may store a 1-bit control parameter Per-pin DFES indicating whether a DFE quantity sub-parameter DFEDQ[15:0] is supported by the OP[0] register for the DFE quantity DFEQ of the DQ[15:0] lines. DFE quantity sub-parameters DFEDQ[15:0], DFEDMI[1:0], and DFEDQS[1:0]) regarding the DQ[15:0] lines, data mask/invert signal DMI0 and DMI1 lines, and data strobe signal DQS0 and DQS1 lines may be referred to as per-pin DFE quantity parameters.

According to example embodiments, the DFE quantity sub-parameters DFEDQ[15:0], DFEDMI[1:0], and DFEDQS[1:0] regarding the DQ[15:0] lines, the data mask/invert signal DMI0 and DMI1 lines, and the data strobe signal DQS0 and DQS1 lines may each be expressed by bits less than or more than 2 bits. The control parameter Per-pin DFES indicating whether the DFE quantity sub-parameters DFEDQ[15:0], DFEDMI[1:0], and DFEDQS[1:0] are supported may include more than 1 bit.

When the control parameter Per-pin DFES indicating whether a per-pin DFE quantity operation parameter is supported by the OP[0] register of the third mode register 1030 is enabled, the DQ[7:0] lines, the first data strobe signal DMI0 line, and the first data strobe signal DQS0 line may apply the DFE quantity sub-parameters DFEDQ[7:0], DFEDMI0, and DFEDQS0 to the DFE quantity DFEQ set by the DFE quantity parameter DFEQL regarding the lower DQ bytes DQ[7:0], thereby setting optimal DFE quantity DFEQ for corresponding data lines, respectively. Also, the DQ[15:8] lines, the second data strobe signal DMI1 line, and the second data strobe signal DQS1 line may apply the DFE quantity sub-parameters DFEDQ[15:8], DFEDMI1, and DFEDQS1 to the DFE quantity DFEQ set by the DFE quantity parameter DFEQU regarding the upper DQ bytes DQ[15:8], thereby setting optimal DFE quantity DFEQ for corresponding data lines, respectively.

Figure 12:
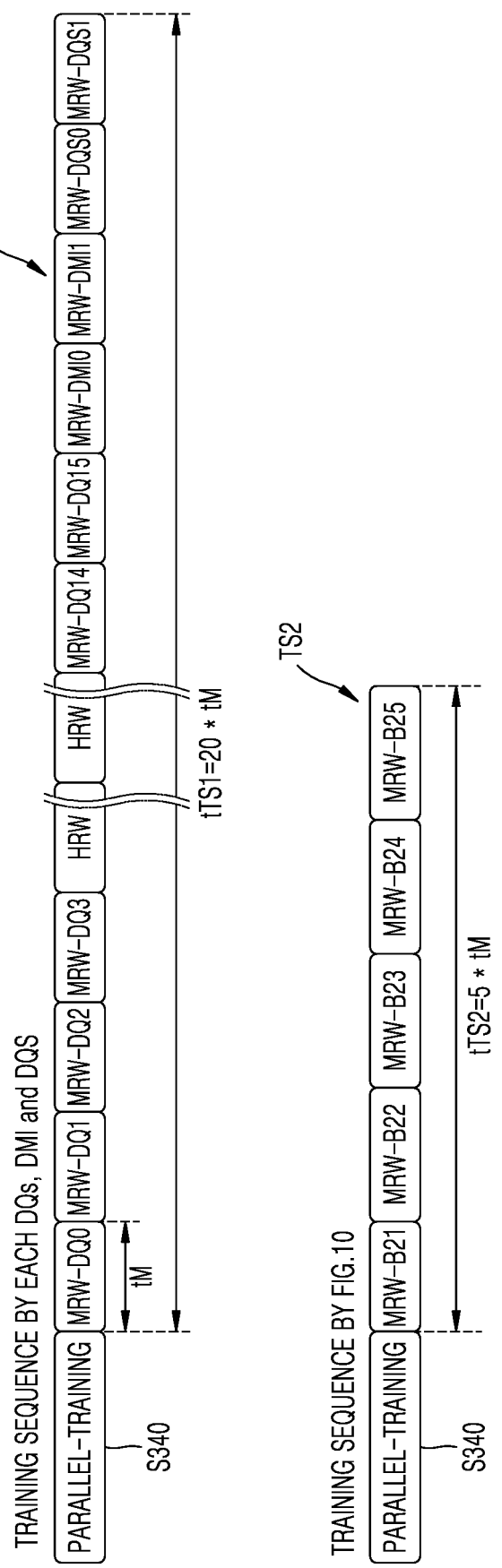
Figure 13:
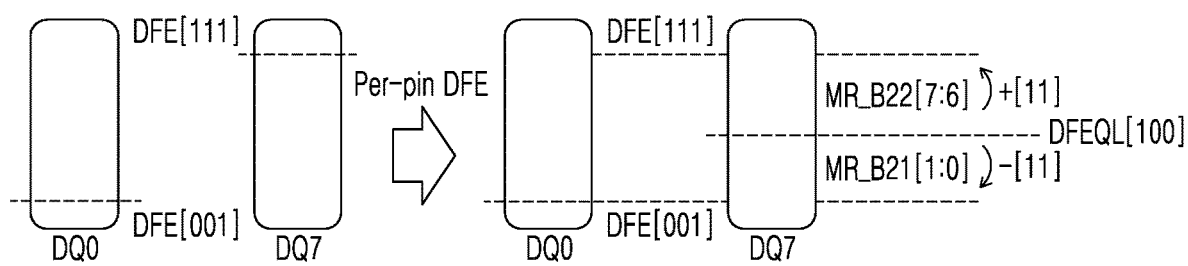

FIGS. 11 to 13 are diagrams for describing examples of operations of the memory device 120 according to example embodiments. FIG. 11 is a diagram for describing a write training operation (operation S340, FIG. 3) for the memory device 120, and FIG. 12 is a diagram for des describing an operation for storing an operation parameter code in the MRS 210. In timing diagrams shown in FIGS. 11 and 12, the horizontal axis and the vertical axis represent time and voltage levels, respectively, and are not necessarily drawn to scale.

Referring to FIGS. 2, 10 and 11, for a write training operation (operation S340) for the memory device 120, a CAS command CAS(WS_WR=1) may be received at a time T0 in synchronization with the clock signal CLK. After a predetermined time tWCKENI_WR is elapsed from the CAS command CAS(WS_WR=1), a write clock signal WCK may be synchronized with the clock signal CLK. At a time point T1, a write command WRITE may be received following the CAS command CAS(WS_WR=1). At a time point T2, write data DQ corresponding to a burst length (e.g., BL16) may be received from the write command WRITE. At this time, a data mask/invert signal DMI may be received together with the write data DQ.

When control parameter DFES indicating whether the global DFE quantity parameters DFEQL and DFEQU are supported for DQ[15:0] lines is disabled, the time point T2 may be set to be a predetermined time tWCK2DQI after a write latency WL of the write command WRITE. In this case, the global DFE quantity parameters DFEQL and DFEQU may be set as default operation parameters during operation S310 (FIG. 3) for initializing the memory device 120.

When the control parameter DFES is enabled, a write data DQ line and a data mask/invert signal DMI line may be demanded to be pre-driven at logic low for a predetermined pre-driving time tDPRE before the time point T2. The pre-driving time tDPRE may be set to be about 2 unit intervals (UI), for example. A UI refers to a unit period in which 1-bit data is retained. In other words, since a DFE needs to process previous data and feed the previous data back to current data, the pre-driving time tDPRE will be needed in consideration of a time elapsed to feed back the previous data.

Referring to FIG. 12, the write training operation (operation S340) for the memory device 120 may be performed in parallel for the DQ[15:0] lines, the data mask/invert signal DMI1[1:0] lines, and the data strobe signal DQS[1:0] lines. An optimal DFE quantity DFEQ for each of the DQ[15:0] lines, the data mask/invert signal DMI1[1:0] lines, and the data strobe signal DQS[1:0] lines may be determined by the write training operation (operation S340).

The optimal DFE quantities DFEQ for the DQ[15:0] lines, the data mask/invert signalDMI1[1:0] lines, and the data strobe signal DQS[1:0] lines may be stored in mode registers of the MRS 210, respectively (operation TS1). In this case, time tTS1 may be elapsed. Since a mode register writing time tM is elapsed for each of 20 signals DQ[15:0], DMI1[1:0], and DQS[1:0], the time tTS1 is approximately 20*tM. Also, the DFE quantity DFEQ of each of the data mask/invert signal DMI1[1:0] lines and the data strobe signal DQS[1:0] lines may express an 8-step coefficient by using a 4-bit parameter code. In this case, when 4 bits are assigned to a parameter regarding the DFE quantity DFEQ of each of the 20 signals DQ[15:0], DMI1[1:0], and DQS [1:0], mode registers for 20*4=80 bits are needed.

In comparison, per-pin DFE quantity parameters DFEDQ [15:0], DFEDMI[1:0], and DFEDQS[1:0] expressed as offset values for the global DFE quantity parameters DFEQL and DFEQU described in FIG. 10 may be stored in the mode registers of the MRS 210, respectively (operation TS2). In this case, time tTS2 may be elapsed, wherein the time tTS2 is approximately equal to write time for five mode registers MR_B21, MR_B22, MR_B23, MR_B24, and MR_B25, that is, about 5*tM. It may be seen that the time tTS2 is significantly shorter than the time tTS1. Also, when the per-pin DFE quantity parameters DFEDQ[15:0], DFEDMI [1:0], and DFEDQS[1:0] are stored in the five mode registers MR_B21, MR_B22, MR_B23, MR_B24, and MR_B25, mode registers for 40 bits are needed as shown in FIG. 10, and thus mode register resources may be saved.

Referring to FIG. 13, it is assumed that, through the write training operation (operation S340) for the memory device 120, the optimal DFE quantity DFEQ of the DQ0 line has DFE[001] from among the 8-step coefficients of the DFE and the optimal DFE quantity DFEQ of the DQ7 line has DFE[111]. When the DFE quantity parameter DFEQL for the lower DQ bytes DQ[7:0] is determined as DFEQL[100] from among the 8-step coefficients of the DFE, the OP[1:0] register of the MR_B21 mode register, which corresponds to a DFE quantity sub-parameter for the DQ0 line, may be set to DFEDQ0[11], and the OP[7:6] register of the MR_B22 mode register, which corresponds to a DFE quantity sub-parameter for the DQ7 line, may be set to DFEDQ7[11]. When a per-pin DFE operation is enabled, the DQ0 line obtains the optimal DFE quantity DFE[001] by subtracting DFEDQ0[11] from DFEQL[100], and the DQ7 line obtains the optimal DFE quantity DFE[111] by subtracting DFEDQ7[11] from DFEQL[100].

Figure 14:
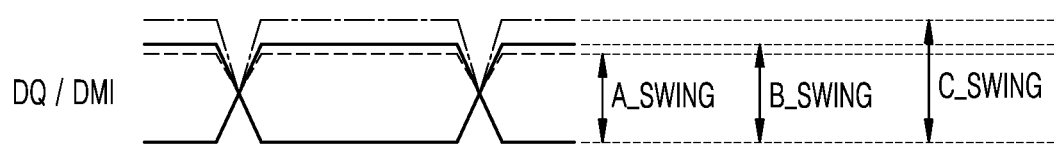
FIG. 14 is a diagram for describing a swing width calibration of a data line according to example embodiments.

FIG. 14 is a diagram for describing a swing width calibration of the DQ line according to example embodiments.

Referring to FIGS. 2 and 14, the VOH specification SPEC of the data DQ output from the data output buffer 270 of the memory device 120 defines that the swing width of the data DQ has a constant value. The memory device 120 may calibrate the swing width of the data DQ through a read training operation (operation S330, FIG. 3). The memory device 120 may compare a voltage level of the data DQ output from the data output buffer 270 with a voltage level of the reference voltage VREF and calibrate sizes of swing widths A_SWING, B_SWING, and C_SWING of the data DQ according to a result of the comparison. The reference voltage VREF has a voltage value that determines the size of a DQ swing width and is set to be an average value of the maximum voltage and the minimum voltage of the DQ swing width.

When the level of the reference voltage VREF varies, it is necessary to have a DQ swing width parameter that determines appropriate DQ swing widths A_SWING, B_SWING, and C_SWING through the read training operation (operation S330). Similar to FIG. 10, the DQ swing width parameter may include a global DQ swing width parameter and a per-pin DQ swing width parameter expressed as an offset value for the global DQ swing width parameter and may be stored in the MRS 210. According to example embodiments, the DQ swing width parameter may be used in combination with the parameter codes of the reference voltage VREF described in FIGS. 6 and 7.

Figure 15:
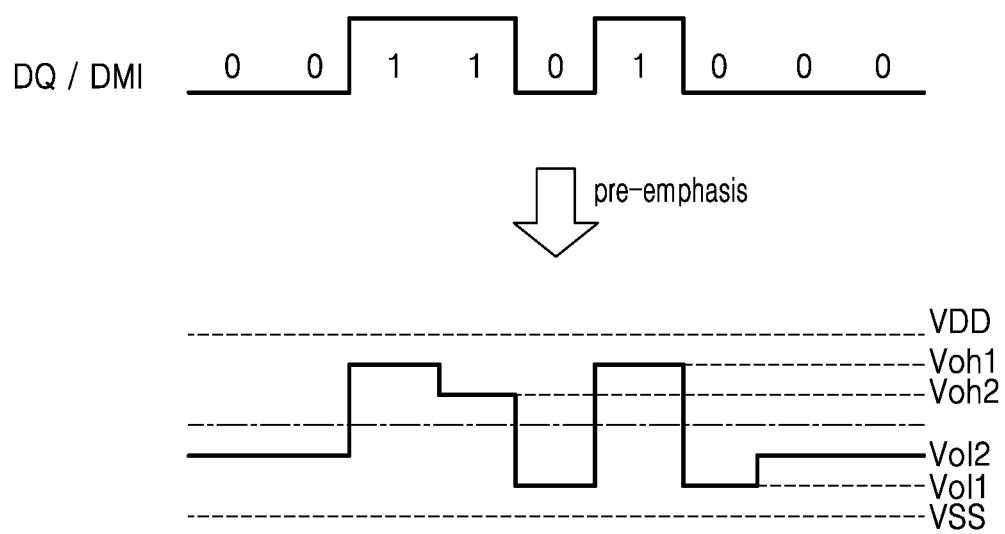
FIG. 15 is a diagram for describing a pre-emphasis operation of a data line according to example embodiments.

FIG. 15 is a diagram for describing a pre-emphasis operation of a DQ line according to example embodiments.

Referring to FIGS. 2 and 15, a pre-emphasis operation may be provided to improve the SI of the DQ line and the data mask/invert signal DMI line. After a signal transmitted through a data bus passes through a transmission line like a wire or a cable on a printed circuit board (PCB) causing attenuation, fluctuations of a reception signal voltage amplitude and a reception signal timing at a receiving end of the transmission line are expected. It is necessary to expand a so-called data eye opening region, which indicates a normal receiving region of the receiving end.

The memory device 120 may include the data output buffer 270 that performs a pre-emphasis operation on the DQ line through the read training operation (operation S330, FIG. 3). For example, when current bit signals of the DQ line and the data mask/invert signal DMI line change from logic low to logic high, a first high output voltage Voh1 may be output, and thus a logic high waveform may be emphasized (emphasis operation). When the current bit signals maintain logic high, a second high output voltage Voh2 lower than the first high output voltage Voh1 may be output to prepare for a next signal change (de-emphasis operation). Also, when the current bit signals change from logic high to logic low, a first low output voltage Vol1 may be output, and thus a logic low waveform may be emphasized (emphasis operation). When the current bit signals maintain logic low, a second low output voltage Vol2 higher than the first low output voltage Vol1 may be output to prepare for a next signal change (de-emphasis operation).

The pre-emphasis operation may enable transmission of a signal over a longer distance at a higher data rate and suppression of a signal reflection at a transmitting end. Therefore, it is necessary to have a DQ pre-emphasis parameter that determines an appropriate DQ pre-emphasis through the read training operation (operation S330). Similar to FIG. 10, the DQ pre-emphasis parameter may include a global DQ pre-emphasis parameter and a per-pin DQ pre-emphasis parameter expressed as an offset value for the global DQ pre-emphasis parameter and may be stored in the MRS 210.

As described above, the MRS 210 may set operation parameters regarding a reference voltage VREF, a DFE quantity, a swing width calibration, and/or a pre-emphasis operation as global operation parameters and per-pin operation parameters, which are expressed as offset values with respect to the global operation parameters, by using a group of registers associated with the corresponding operation parameters, that is, a first mode register, a second mode register, and a third mode register.

For example, in some embodiments, a combination of a global operation parameter code and a first offset value (FIGS. 6, 7 and 10) for a first pin (for example, any of the pins associated with DQ in FIG. 1) is configured to determine a first decision level of a first sampler (for example, sampler 920) of FIG. 9 by adjusting a VREF value, wherein the first sampler is configured to operate on the first signal line (for example 808 of FIG. 8) connected to the first pin. A signal on the first signal line, considered as single pulse after operation of DFE 808 of FIG. 8 or the DFE taps 911_1, . . . , 911_n, may have an effective representation as shown in FIG. 8 item 810.

In another example, in some embodiments, a combination of the global operation parameter code and the first offset value for the first pin is configured to determine a first decision feedback equalizer (DFE) tap value (for example, FIG. 9 tap 911_1) of a first DFE (for example DFE 808) used with a first sampler (for example, sampler 920), wherein the first DFE and the first sampler are configured to operate on the first signal line connected to the first pin. Other than this description regarding DFE tap value, the global operation parameter code, a first offset value, first pin and first sampler may be as described in the immediately above description concerning decision level.

In yet another example, in some embodiments, a combination of the global operation parameter code and a first offset value for the first pin is configured to determine a first resistance value (OTD) used to terminate the first pin, wherein the first pin is connected to the first sampler, and the first sampler is configured to operate on the first signal line connected to the first pin. Other than this description regarding resistance value (OTD), the global operation parameter code, a first offset value, first pin and first sampler may be as described in the immediately above description concerning decision level.

Various operation parameters associated with the MRS 210 may include a DQ-ODT value, a CA-ODT value, a VREF-CA value, a VREF-CA range, and a VREF-DQ range. These operation parameters may also be set as global operation parameters and per-pin operation parameters, which are expressed as offset values with respect to the global operation parameters, by using a group of registers associated with the corresponding operation parameters, that is, the first mode registers, the second mode registers, and the third mode registers. Global operation parameters associated with the CA-ODT value, the VREF-CA value, and the VREF-CA range may be provided as operation parameter codes for an entire CA signal.

A memory device may apply a common operating condition to signal pins associated with operation parameters by using a global operation parameter code and additionally applying specific offset operating conditions to the respective signal pins associated with the operation parameters by using a per-pin operation parameter code, thereby controlling the signal pins with operating conditions optimized for the characteristics of the respective signal pins. Also, by setting an offset appearing as a difference from a global operation parameter as a per-pin operation parameter code, the number of registers of a mode register needed to store operation parameter codes and an update time of the mode register may be reduced.

While example embodiments have been particularly shown and described, it will be understood that various changes in form and details may be made therein without departing from the spirit and scope of the following claims.

What is claimed is:

1. An apparatus comprising:
a plurality of signal pins connected to a plurality of signal lines, wherein each signal pin of the plurality of signal pins is connected to a signal line of the plurality of signal lines, and each signal line carries a signal; and
a mode register set configured to store a first parameter code and a second parameter code for one operation parameter of the apparatus in a first register and a second register, respectively,
wherein the first parameter code comprises a global operation parameter code associated with an operating condition for signal pins associated with the one operation parameter,
the second parameter code comprises a per-pin operation parameter code associated with operating conditions of the respective signal pins associated with the one operation parameter, and
the per-pin operation parameter code is expressed as an offset value from the global operation parameter code.

2. The apparatus of claim 1, wherein, to set a current operating condition for the one operation parameter, the mode register set is further configured to store a first control code for selecting the first parameter code in a third register and store a second control code for selecting the second parameter code in a fourth register.

3. The apparatus of claim 1, wherein the one operation parameter comprises a decision feedback equalizer (DFE) quantity operation parameter associated with operating conditions of data (DQ) pins, and
wherein the signal pins comprise the DQ pins.

4. The apparatus of claim 3, wherein the first parameter code comprises a first global operation parameter code and a second global operation parameter code,
the first global operation parameter code is a lower byte DFE quantity parameter code for lower DQ byte pins from among the DQ pins, and
the second global operation parameter code is an upper byte DFE quantity parameter code for upper DQ byte pins from among the DQ pins.

5. The apparatus of claim 1, further comprising a reference voltage generation circuit connected to the plurality of signal lines,
wherein the one operation parameter comprises a reference voltage operation parameter associated with the reference voltage generation circuit.

6. The apparatus of claim 1, further comprising an on-die termination (ODT) circuit connected to the plurality of signal lines,
wherein the one operation parameter comprises an operation parameter associated with the ODT circuit.

7. The apparatus of claim 1, wherein the one operation parameter comprises an operation parameter associated with command/address (CA) pins from among the signal pins.

8. The apparatus of claim 1, wherein the one operation parameter comprises at least one of a swing width parameter, a driving strength parameter, a pre-emphasis parameter, an on-die termination (ODT) parameter, a reference voltage parameter, or a decision feedback equalizer (DFE) quantity parameter associated with the signal pins.

9. A memory device configured to be set to a current operating condition, the memory device comprising:
a mode register configured to store a first parameter code and a second parameter code for one operation parameter of the memory device to set a first operating condition and a second operating condition for the one operation parameter; and
a control logic circuit configured to set the first operating condition as the current operating condition by using the first parameter code for the one operation parameter based on a first control code stored in the mode register and to set the second operating condition as the current operating condition by using the first parameter code and the second parameter code for the one operation parameter based on a second control code stored in the mode register,
wherein the second parameter code is expressed as an offset value from the first parameter code.

10. The memory device of claim 9, wherein the first parameter code comprises a global operation parameter code associated with the first operating condition, and the second parameter code comprises a per-pin operation parameter code associated with the second operating condition.

11. The memory device of claim 10, wherein the first parameter code comprises a first global operation parameter code and a second global operation parameter code,
the first global operation parameter code is a lower byte operation parameter code for lower data (DQ) byte pins from among DQ pins of the memory device, and
the second global operation parameter code is an upper byte operation parameter code for upper DQ byte pins from among the DQ pins.

12. The memory device of claim 9, further comprising a decision feedback equalizer (DFE) circuit,
wherein the one operation parameter comprises a DFE quantity parameter associated with the DFE circuit.

13. The memory device of claim 9, further comprising a reference voltage generation circuit,
wherein the one operation parameter comprises a reference voltage operation parameter associated with the reference voltage generation circuit.

14. The memory device of claim 9, further comprising an on-die termination (ODT) circuit,
wherein the one operation parameter comprises an operation parameter associated with the ODT circuit.

15. The memory device of claim 9, wherein the one operation parameter comprises an operation parameter associated with command/address (CA) pins.

16. The memory device of claim 9, wherein the memory device is configured to perform a training operation for determining the first parameter code and the second parameter code for the one operation parameter through a memory controller outside the memory device.

17. The memory device of claim 16, wherein the first operating condition and the second operating condition are associated with an operating condition for a memory bus coupled between the memory device and the memory controller.

18. The memory device of claim 17, wherein operation parameters associated with an operation parameter regarding the memory bus comprise at least one of a swing width parameter, a pre-emphasis parameter, an on-die termination (ODT) parameter, a reference voltage parameter, or a decision feedback equalizer (DFE) quantity parameter.

19. A method of setting a current operating condition of a memory device, the method comprising:
storing a first parameter code used to set a first operating condition for one operation parameter in a first register of a mode register;
storing a second parameter code used to set a second operating condition for the one operation parameter in a second register of the mode register, wherein the second parameter code is expressed as an offset value from the first parameter code;
setting the first operating condition as the current operating condition by using the first parameter code for the one operation parameter; and
setting the second operating condition as the current operating condition by using the first parameter code and the second parameter code for the one operation parameter.

20. The method of claim 19, further comprising selecting the first parameter code or both the first parameter code and the second parameter code to set the current operating condition.

* * * * *